United States Patent [19]

Buchanan

[11] Patent Number: 4,546,366
[45] Date of Patent: Oct. 8, 1985

[54] POLYSILICON/SILICON JUNCTION FIELD EFFECT TRANSISTORS AND INTEGRATED CIRCUITS (POSFET)

[76] Inventor: Bobby L. Buchanan, 351 Baldwin Rd., Carlisle, Mass. 01741

[21] Appl. No.: 350,496

[22] Filed: Feb. 19, 1982

Related U.S. Application Data

[60] Division of Ser. No. 147,042, May 6, 1980, , Continuation of Ser. No. 899,673, Apr. 24, 1978.

[51] Int. Cl.⁴ .................................. H01L 29/80
[52] U.S. Cl. .............................. 357/22; 357/58; 357/59
[58] Field of Search .................... 357/22, 59, 58

[56] References Cited

U.S. PATENT DOCUMENTS

| | | | |
|---|---|---|---|
| 3,847,687 | 11/1974 | Davidsohn et al. | 357/59 |
| 4,065,782 | 11/1977 | Gray et al. | 357/22 |
| 4,072,545 | 2/1978 | De La Moneda | 357/59 |
| 4,072,974 | 2/1978 | Ipri | 357/59 |
| 4,124,933 | 11/1978 | Nicholas | 357/59 |
| 4,176,372 | 11/1979 | Matsushita et al. | 357/59 |
| 4,187,514 | 2/1980 | Tomisawa et al. | 357/22 |
| 4,222,164 | 9/1980 | Triebwasser | 357/22 |
| 4,231,051 | 10/1980 | Custode et al. | 357/59 |

Primary Examiner—Joseph E. Clawson, Jr.
Attorney, Agent, or Firm—Donald J. Singer; William G. Auton

[57] ABSTRACT

A junction field effect transistor is fabricated in crystalline silicon by using oppositely doped polysilicon as the gate (POSFET). The depletion region of the pn (or np) junction formed at the polysilicon/silicon interface is used as the gate electrode to modulate the current path through the silicon channel from source to drain, the source and drain contacts may either be conventional metal or polysilicon heavily doped of the same conductivity type as the single crystal silicon substrate.

5 Claims, 7 Drawing Figures

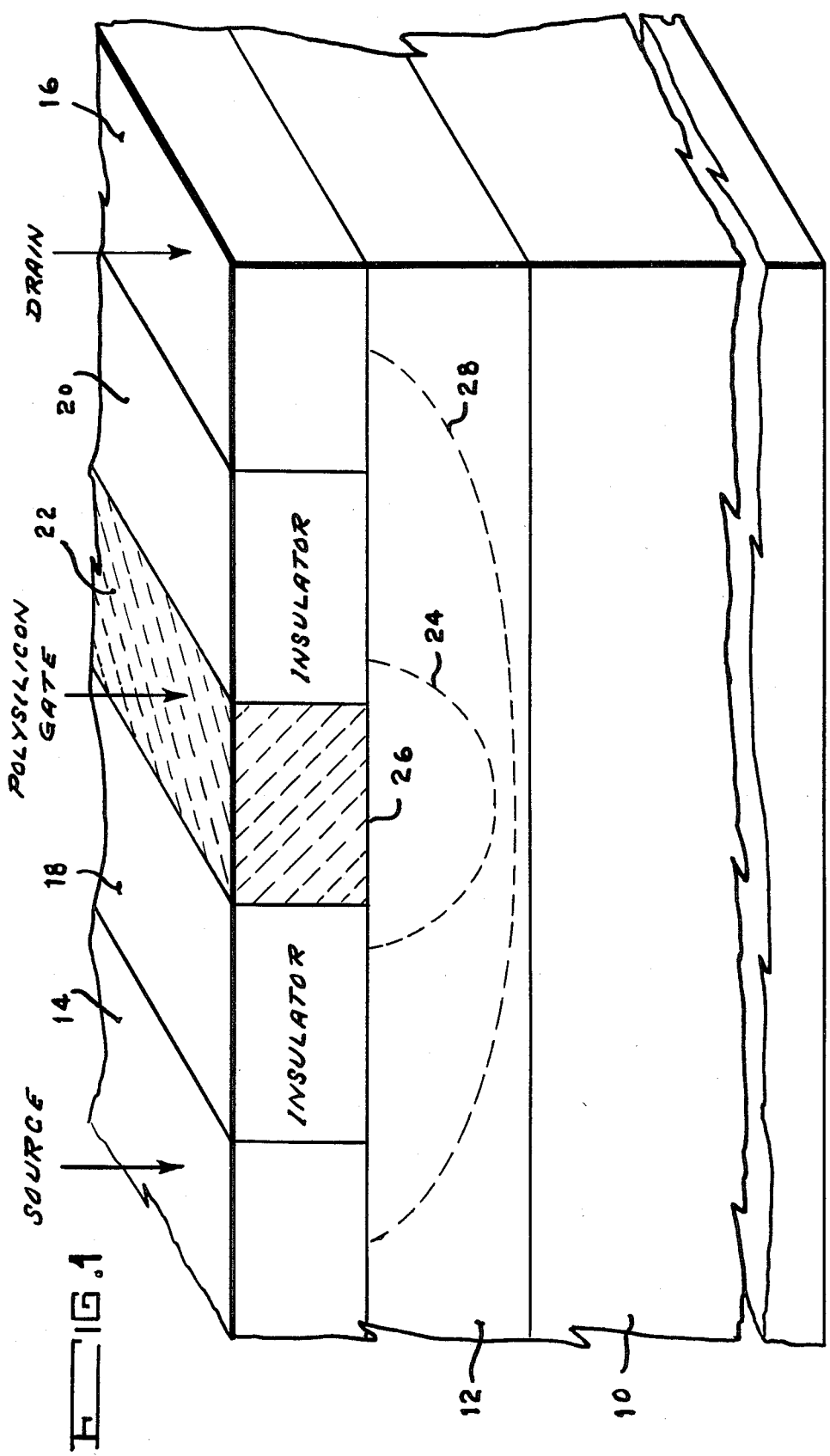

POLYSILICON/SILICON JUNCTION FIELD EFFECT TRANSISTORS AND INTEGRATED CIRCUITS (POSFET)

STATEMENT OF GOVERNMENT INTEREST

The invention described herein may be manufactured and used by or for the Government for governmental purposes without the payment of any royalty thereon.

This is a division of co-pending patent application Ser. No. 147,042 entitled POLYSILICON/SILICON JUNCTION FIELD EFFECT TRANSISTORS AND INTEGRATED CIRCUITS (POSFET) filed by Bobby L. Buchanan May 6, 1980, which was a continuing application from the patent application Ser. No. 899,673 entitled POLYSILICON/SILICON JUNCTION FIELD EFFECT TRANSISTORS AND INTEGRATED CIRCUITS (POFSET) filed by Bobby L. Buchanan Apr. 24, 1978.

BACKGROUND OF THE INVENTION

This invention relates generally to semiconductor devices and integrated circuits and more particularly to such devices and circuits utilizing a polysilicon material in place of other known materials.

The development of large scale integrated circuits (LSI) has been one of the major steps forward in the semiconductor circuit art. This improvement brought to the forefront new techniques which allow many circuits to be constructed on a single clip. These technologies have appropriately derived acrynoms allowing those skilled in the art to readily understand the construction and operation of the device and in some instances the circuit.

By way of example, these acrynoms which are of interest to this invention include MOS (metal oxide semiconductor), JFET (junction field effect transistors), and the MESFET (metal silicon field effect transistor) perhaps more appropriately termed a Schottky junction field effect transistor.

The technology that developed MOS integrated circuits and LSI's has adopted polycrystalline silicon ("polysilicon") as an effective material for use, as a mechanical support, as resistive or field shaping layers and as the conductor over the gate insulator in MOS devices. However, for a number of reasons polysilicon has never been thought to be practical in the technology that accompanied the JFET or MESFET.

The JFET has not been competitive with the LSI art because the conventional JFET is difficult to utilize for fabricating high density circuits necessary for implementing LSI technology techniques. This is partially because of biasing difficulties when conventional p-n junction isolation techniques are used. Also the connectivity, the art of connecting transistor components in an LSI is more difficult for conventional JFET's because of the length of the metal contacts and the multi-level metalization required. Further the JFET gate metal must be placed precisely over the gate p-n junction which limits manufacturing very small high density JFET devices required for LSI.

If the JFET is used for making LSI in unconventional dielectrically isolated structures such as silicon on sapphire (SOS), so that p-n junction isolation is not required, problems occur because of the thickness of the silicon in the (SOS) structure that is required for forming the gate p-n junction and allowing for the depletion region extension. This thickness problem also does not allow conventional JFET structures to be fabricated on the same chip as MOS structures not being fabricated in SOS structures.

Because of its nature and theory of operation, the JFET has been shown to be an effective device for evaluating the silicon sapphire interface to predict the radiation induced leakage current effects that would occur for MOS/LSI made in SOS structures. However the thickness requirement of the silicon substrate presently restricts conventional JFET test structures from being fabricated in real MOS/LSI structures.

SUMMARY OF THE INVENTION

The invention is characterized by the utilization of polysilicon material in junction field effect transistors. Semiconductor devices having PN junctions and in particular those of the field effect class have consistently been fabricated utilizing metal contacts and metal gate electrodes. This invention has created a new class of semiconductor along the lines of the JFET and MESFET and is appropriately labeled a POSFET.

The POSFET provides a semiconductor device similar in electrical character to a JFET and a MESFET and further provides a gate junction at a polysilicon/silicon interface similar to the Schottky metal/silicon junction. The POSFET has the combined advantages of the JFET and the MESFET plus the advantages of the polysilicon interconnect technology. The POSFET has the decided advantages of, being constructed in thin layers, radiation hardness and compatability with existing MOS integrated circuit technology. In addition the POSFET avoids serious connectivity problems that arise in the manufacture of conventional semiconductor devices and readily allows the layering of circuits and the assembly of high density high speed JFET integrated circuits.

In the invention a junction field effect transistor is fabricated in crystalline silicon by using oppositely doped polysilicon as the gate. The depletion region of the pn (or np) junction formed at the polysilicon/silicon interface is used as the gate electrode to modulate the current path through the silicon channel from source to drain. The source and drain contacts may either be conventional metal or polysilicon heavily doped of the same conductivity type as the single crystal silicon substrate. The material bonding the backside of the channel may be either the conventional silicon of opposite conductivity type or a non-conducting material (insulator) such as sapphire. In addition to an all JFET silicon gate MOS technology this type of JFET structure is compatible with the polysilicon gate LSI technology made in a thin layer of silicon grown on sapphire. Polysilicon JFET devices fabricated on the same silicon on sapphire chip as an MOS integrated circuit gives both circuit advantages and provides a simple means for evaluating the quality of the silicon/sapphire interface.

It is therefore an object of this invention to provide a new and improved semiconductor device.

It is another object of the invention to provide a new and improved field effect transistor.

It is still another object of the invention to provide a junction field effect transistor that is easily fabricated.

It is still a further object of the invention to provide a junction field effect transistor that resists the effects of ionizing radiation.

It is another object of the invention to provide a field effect transistor that is compatible with MOS technology.

It is another object of the invention to provide a junction field effect transistor that is capable of being manufactured in high density integrated circuits.

It is another object of this invention to provide a junction field effect technology that is capable of being manufactured with both enhancement and depletion devices and devices of opposite polarity on the same chip.

It is another object of the invention to provide a junction field effect transistor that is adaptable to layering techniques in manufacture.

It is another object of the invention to provide a new improved field effect transistor that utilizes no metal in its design.

It is another object of the invention to provide a new and improved field effect transistor that may be constructed of thin materials such as sapphire.

These and other advantages, features and objects of the invention will become more apparent from the following description taken in connection with the illustrative embodiments in the accompanying drawings.

DESCRIPTION OF THE DRAWINGS

FIG. 1 is a perspective view of one general embodiment of the invention;

DESCRIPTION OF THE PREFERRED EMBODIMENT

Figure 2A:
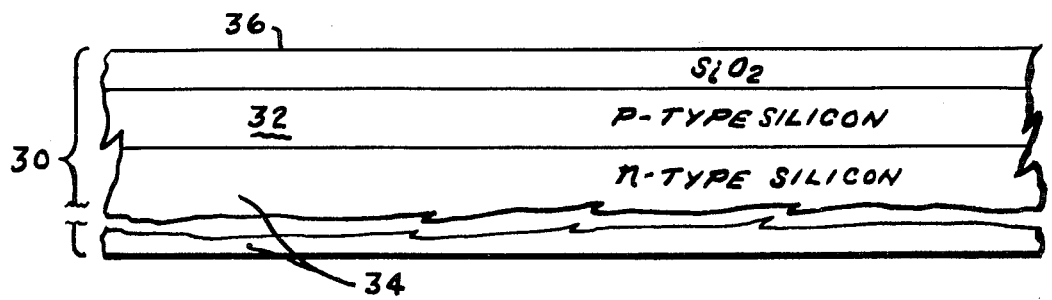
FIG. 2 is a cross-sectional view of the fabrication of an embodiment of the invention.

Referring now to FIG. 1 a general schematic figure is shown with the essential features and possible construction variations of the POSFET.

The structure is deposited upon an n type silicon or sapphire bounding substrate 10, (other materials are available as well as p type silicon). Where the n type silicon is utilized a p type crystalline silicon 12 is deposited over the n type silicon. Source 14 and drain 16 conductors are deposited on the p type silicon and may be formed conventionally of metal such as aluminum or with a heavily doped p+ polysilicon.

Adjacent each conductor (source and drain) are insulators 18 and 20 which are formed of either conventional $SiO_2$ or with undoped polysilicon. Between the insulators is the gate component and junction 22. The gate is formed of heavily doped n+ polysilicon. A depletion region 24 extending from the polysilicon/silicon rectifying junction (26) and closes off the current path 28 in the p type silicon 12. It should be understood that the n and p type materials might be reversed if required with satisfactory results.

Utilizing heavily doped polysilicon as both gate contact and the gate junction results in a great simplification because, (a) alignment and tolerance for the gate metalization is not required; (b) the polysilicon gate contact allows for multi-level intgerconnects since $SiO_2$ can be deposited or grown over it and a metal contact put over the $SiO_2$. (In a conventional JFET the gate junction is formed by diffusing n type dopants into the silicon and then laying down a metal stripe usually aluminum for the gate contact.)

Since the polycrystalline silicon growth or deposition has been developed as a standard process for making silicon-gate MOS transistors, there are a number of standard ways for depositing and doping polysilicon. This fact taken in combination with the number of other standard process variations and construction variations shown in FIG. 1 makes the number of possible ways of fabricating the POSFET substantial.

Figure 2B:
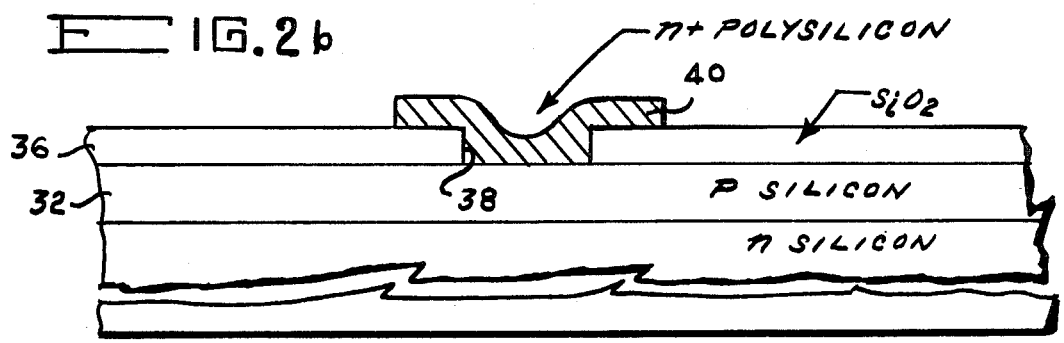
Figure 2C:
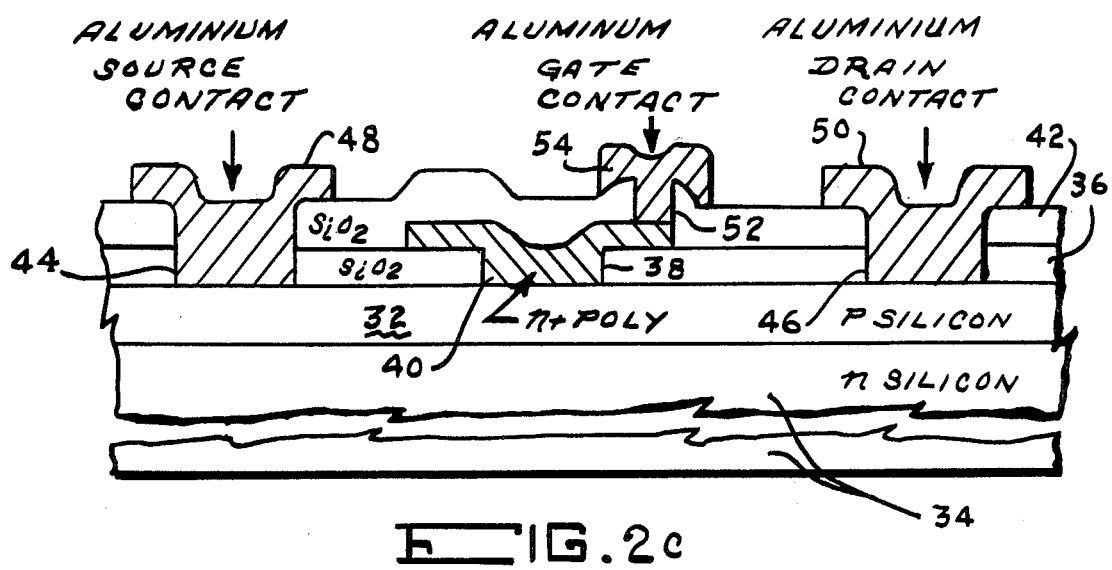
Figure 3A:
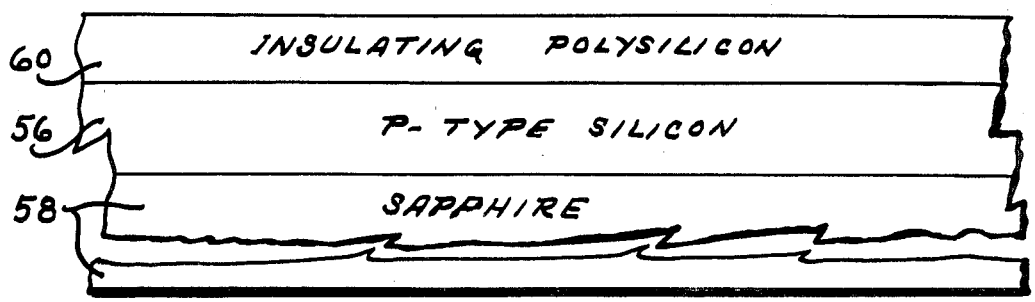
FIG. 3 is a cross-sectional view of the fabrication of another embodiment of the invention.
Figure 3B:
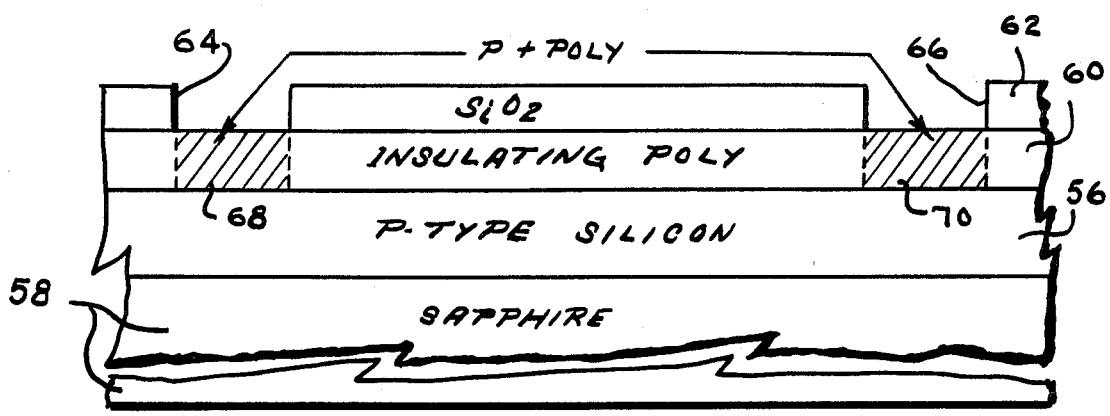

Two specific fabrication embodiments are shown in FIGS. 2 and 3. In FIG. 2a, commencing with a silicon epi wafer 30, with a p type silicon layer 32 approximately two microns thick on an n type silicon substrate 34, a layer (36) of $SiO_2$ is thermally grown. Using standard and conventional masking techniques a gate region 38 is defined by etching down to the silicon 32 and depositing n-type polysilicon 40 doped to approximately $10^{19}$ donors per cc. This may be achieved by utilizing a phosphine-silane gas in the approximate phosphine-silane ratio of $10^{-4}$ at 800° C. This result is shown in FIG. 2b.

Again, utilizing known masking and passivation techniques, as shown in FIG. 2c apply a layer 42 of $SiO_2$ over the polysilicon gate 40. Contact openings 44, 46 are etched into the $SiO_2$ layers 36, 42 as source and drain openings and aluminum contacts 48, 50 are evaporated in place. Opening 52 is provided for the gate contact and aluminum contact 54 is evaporated in place. The sidewall isolation is not shown, but can be accomplished in numerous ways depending on how the device is incorporated in an integrated circuit.

Figure 3C:
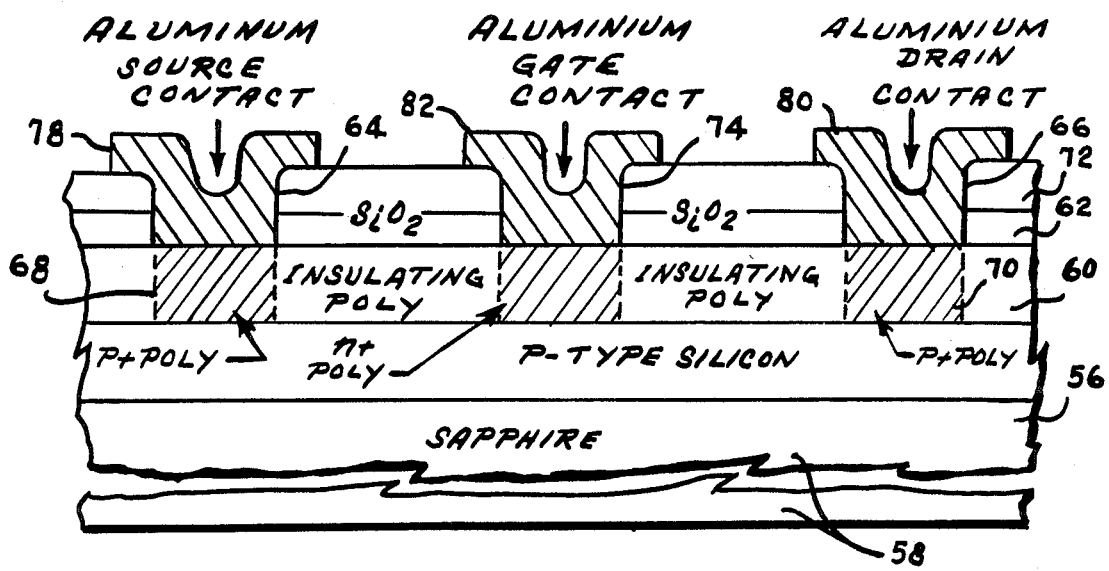

FIG. 3 shows another embodiment of the invention. Starting with a p type layer 56 approximately one micron thick as shown in FIG. 3a, on a sapphire substrate 58, grow a layer 60 of undoped insulating polysilicon. Using standard techniques, grow or deposit a layer 62 of $SiO_2$, mask and etch to define source 64 and drain 66 regions. Heavily diffuse or ion implant p type (Boron) 68, 70 into the exposed polysilicon source and drain (68, 70). Continuing with known processes grow or deposit another layer 72 of $SiO_2$ over the entire device, mask to define the gate contact region 74. Etch and heavily diffuse or ion implant n type (phosphorous) into the exposed gate region polysilicon 76. Mask and etch out $SiO_2$ over the source 68 drain and gate 76 contacts and metalize 78, 80, 82 by standard aluminum evaporation techniques. The resulting device is shown in FIG. 3c. The side wall isolation is not shown, but standard islands used in MOS/SOS technology may be utilized. This type of device can easily be incorporated into an integrated circuit and when this is done, devices are connected together via the highly conductive polysilicon and the metalization step is not required except for the relatively few devices which are contacted to conduct external to the integrated circuit chip.

Although the invention has been described with reference to particular embodiments, it will be understood to those skilled in the art that the invention is capable of a variety of alternative embodiments within the spirit and scope of the appended claims.

I claim:

1. A junction field effect transistor for use with large scale integrated circuits having at least one set of source, drain and gate components comprising: a bounding substrate; an overlay substrate having a given conductivity type overlying the bounding substrate; a planar layer of insulative material overlying and contacting the overlay substrate and having formed therein apertures for receiving source, drain and gate material; polysilicon gate material of an opposite conductivity type than said overlay substrate filling said gate aperture and overlying the overlay substrate forming a p-n junction at the interface; conductive material filling the source and drain apertures; and electrical contacts for connecting the source, drain and gate components to an electrical circuit, wherein the insulative material is polysilicon, the gate component is formed of polysilicon doped in the conductivity type opposite that of the overlay substrate material and source and drain components are formed of polysilicon doped in the conductivity type similar to that of the overlay substrate.

2. A junction field effect transistor for use with large scale integrated circuits having at least one set of source, drain and gate components comprising: a bounding substrate; an overlay substrate having a given conductivity type overlying the bounding substrate; a planar layer of insulative material overlying and contacting the overlay substrate and having formed therein apertures for receiving source, drain and gate material; polysilicon gate material of an opposite conductivity type than said overlay substrate filling said gate aperture and overlying the overlay substrate forming a p-n junction at the interface; conductive material filling the source and drain apertures; and electrical contacts for connecting the source, drain and gate components to an electrical circuit, and wherein said bounding substrate is n type silicon, said overlay substrate is p type silicon, said gate material is heavily doped n+ polysilicon and said conductive material is aluminum, and said layer of insulative material is undoped polysilicon.

3. A junction field effect transistor as defined in claim 1 wherein said gate material is n type polysilicon doped to approximately $10^{19}$ donors per cubic centimeter.

4. A junction field effect transistor as defined in claim 1 wherein said overlay substrate is p type crystalline silicon.

5. A junction field effect transistor as defined in claim 1 wherein said bounding substrate is sapphire.

* * * * *